United States Patent
Vieux-Rochaz et al.

(10) Patent No.: US 6,522,132 B1
(45) Date of Patent: Feb. 18, 2003

(54) LINEAR ANGULAR SENSOR WITH MAGNETORESISTORS

(75) Inventors: Line Vieux-Rochaz, Sassenage (FR); Marie-Hélène Vaudaine, Seyssins (FR); Robert Cuchet, Grenoble (FR); Thierry Braisaz, St Egreve (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 09/582,690

(22) PCT Filed: Jan. 4, 1999

(86) PCT No.: PCT/FR99/00001

§ 371 (c)(1),
(2), (4) Date: Jun. 29, 2000

(87) PCT Pub. No.: WO99/35469

PCT Pub. Date: Jul. 15, 1999

(30) Foreign Application Priority Data

Jan. 5, 1998 (FR) .......................................... 98 00018

(51) Int. Cl.[7] ................................................ G01B 7/30
(52) U.S. Cl. ............................ 324/207.21; 324/207.25; 324/252
(58) Field of Search ........................... 324/207.21, 252, 324/207.12, 207.19; 338/32 R; 327/510, 511

(56) References Cited

U.S. PATENT DOCUMENTS

| 4,949,039 A | | 8/1990 | Grunberg .................... 324/252 |
| 5,005,408 A | * | 4/1991 | Glassey ....................... 73/301 |
| 5,561,368 A | * | 10/1996 | Dovel et al. ................. 324/252 |
| 5,629,620 A | | 5/1997 | Jeffers et al. ............... 324/210 |
| 5,650,720 A | | 7/1997 | Brockmuller et al. ........ 324/173 |
| 5,936,400 A | * | 8/1999 | Tchertkov et al. ..... 324/207.21 |
| 6,232,776 B1 | * | 5/2001 | Pant et al. ............. 324/207.21 |

FOREIGN PATENT DOCUMENTS

| DE | 195 32 674 | 9/1995 | ............ G01B/7/30 |
| DE | 195 36 433 | 9/1995 | ............ G01B/7/30 |
| DE | 196 14 460 | 4/1996 | ............ H01L/43/08 |

OTHER PUBLICATIONS

Clemens, W. et al, "Contectless potentiometer based on giant magnetoresistance sensors", J. Appl. Phys, vol. 81, No. 8 Apr. 1997.

* cited by examiner

Primary Examiner—Jay Patidar
(74) Attorney, Agent, or Firm—Hayes Soloway PC

(57) ABSTRACT

At least two magnetoresistors laid out perpendicularly are used. These magnetoresistors are installed in a bridge, the measurement signal being taken from the mid-point of the bridge. This signal is linear over a very wide range. Application to measurement of the orientation of a magnetic field or the angular position of an object.

10 Claims, 4 Drawing Sheets

LINEAR ANGULAR SENSOR WITH MAGNETORESISTORS

TECHNICAL FIELD

The purpose of this invention is a linear angular position sensor with magnetoresistors. It is widely used in applications for measuring the orientation of a magnetic field, and more particularly for detection of the angular position of an object equipped with a magnetic field source. The sensor according to the invention has a measurement plane and it outputs a signal that is unequivocally related to the angle between the component of the field in this plane and a reference direction also located in this plane. The angular position of any object (part, motor, rotor, antenna, control button, etc.) may be identified by a sensor according to the invention.

STATE OF PRIOR ART

Devices for detecting the orientation of a magnetic field using magnetoresistive materials based on ferromagnetic transition metals such as nickel, iron, cobalt or their alloys, are known. These materials in the form of bars can be used to make devices that output approximately sinusoidal signals as a function of the orientation of the applied field. These devices have the disadvantage that they require electronic processing means in order to obtain a measurement signal that is a linear function of the angle.

Sensors are also known that use stacks of layers leading to a giant magnetoresistance (GMR) effect as the magnetoresistive material. These stacks are usually composed of two thin magnetic layers separated by a thin non-magnetic and electrically conducting layer. Structures of this type, also called spin valves, are described in U.S. Pat. No. 4,949,039. A device for detecting the angular position of an object using this type of giant magnetoresistance effect is described in U.S. Pat. No. 5,650,721 and in the article by W. CLEMENS et al. entitled "Contactless potentiometer based on giant magnetoresistance sensors", published in the Jour. Appl. Phys. 81, (8), Apr. 15, 1997, pp. 4310–4312. This technique uses one spin valve magnetoresistor, or possibly two laid out perpendicularly. The signal output by each magnetoresistor is approximately sinusoidal depending on the angle of the field with respect to a reference direction. But is not rigorously sinusoidal due to effects related to demagnetizing fields. Furthermore, there is a rotational hysteresis of 2° that limits the resolution of the instrument. Furthermore, it is impossible to process fields outside the range 4.4 kA/m and 27.2 kA/m.

Other known sensors use materials with giant magnetoresistance effect with isotropic response. Remember that an isotropic magnetoresistive material is a material for which the resistance varies as a function of the field amplitude, but does not vary as a function of the field direction in the plane; the response is the same at all angles.

An angle detector composed of two magnetoresistors installed at 90° to each other in a half-bridge cannot give a response that depends on the angle formed by the field and a reference direction in the plane, unless the response of each of these magnetoresistors in the field is different so that an unbalance can be created in the bridge.

In the case of an isotropic giant effect material, the two magnetoresistors for which the dimensions are defined by etching usually have the same isotropic response and there is no angle detection effect. One solution for making an angle detector with an isotropic giant effect material using two magnetoresistors at 90° and a half bridge was given in patent DE 195 32674. This document proposes placing magnetic flux guides around the magnetoresistors, the function of which is different depending on which of the magnetoresistors is being considered, so that the response of the two magnetoresistors is different. For example, if the applied magnetic field is parallel to one of the magnetoresistors, it will be perpendicular to the other and the flux guides capture all flux lines created by the field and which should have entered the first magnetoresistor. Therefore, the first magnetoresistor does not see the field and its change in resistance is zero. But conversely, these guides concentrate the entire flux in the second magnetoresistor, and consequently the field and the resistance of the second magnetoresistor will reduce.

Obviously, the bridge is unbalanced and the sensor outputs a response.

This invention proposes to avoid these flux guides, while making sure that the two magnetoresistors give different responses.

DISCLOSURE OF THE INVENTION

This invention proposes to make anisotropic shaped magnetoresistors to confer an anisotropic response to them as a function of the field (whereas the material is intrinsically isotropic). This anisotropy shape may be achieved by etching with appropriate dimensions. Furthermore, the invention consists of a particular assembly (a bridge) in which the read signal is taken off at the midpoint of the bridge. Surprisingly, the signal obtained is linear over a very wide angular range (better than 5% over 90°). Consequently, there is no longer a need to use signal processing electronics to linearize the read signal. Furthermore, the hysteresis has disappeared. Finally, in an assembly according to the invention, there is no longer any need to use polarization of magnetoresistors.

More precisely, the purpose of this invention is an angular sensor comprising at least two magnetoresistors and a material with giant magnetoresistive effect and with isotropic response, these magnetoresistors being placed perpendicularly, characterized by the fact that the two magnetoresistors have anisotropy shape such that their response in a magnetic field is anisotropic, the two magnetoresistors being connected in series and forming a bridge with two ends and one midpoint, the power supply means being connected at the ends of the bridge and means of measuring the unbalance of the bridge being connected at the midpoint of the bridge.

In one advantageous embodiment, the invention combines two bridges of this type to form a Wheatstone bridge with four magnetoresistors.

The linearity of the sensor may be further improved by the addition of a resistance made of a magnetosensitive material mounted either in series with the input of the bridge, or in parallel on its output.

Advantageously, the magnetoresistors are made from a stack of layers based on FeNi/Ag. Obviously, other stacks may be used and particularly stacks based on Fe/Cr or Fe/Cu or NiFe/Cu.

DETAILED DESCRIPTION OF EMBODIMENT

Figure 1:
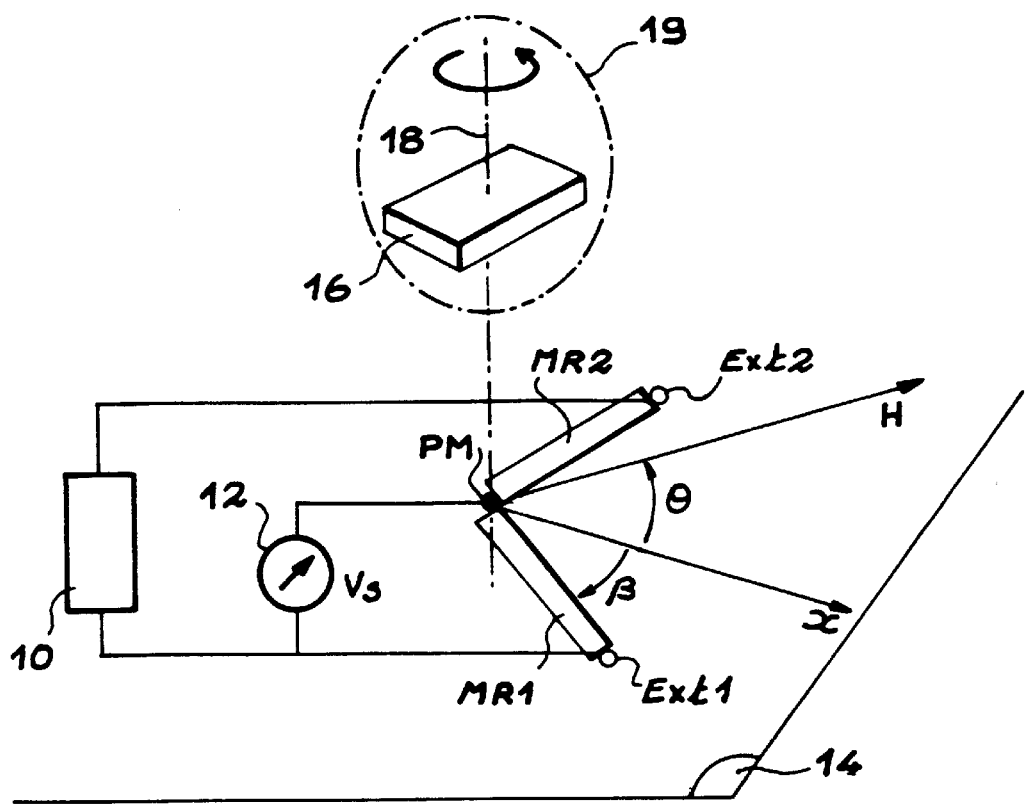
FIG. 1 diagrammatically shows a device according to the invention with two magnetoresistors laid out in a bridge.

FIG. 1 shows two giant effect magnetoresistors MR1, MR2 (or spin valve type magnetoresistors) laid out perpendicularly. These two magnetoresistors are connected in series and form a resistive bridge with two ends Ext1, Ext2 and a midpoint PM which is the magnetoresistor connection point. A voltage power supply means 10 is connected to the ends of the bridge Ext1, Ext2, and a measurement means 12 is provided between the midpoint PM and one of the ends (Ext1 in the variant in the Figure).

FIG. 1 shows the magnetoresistors in perspective. These two magnetoresistors define a plane 14. A reference axis x passing through the midpoint PM can be defined in this plane. This axis makes an angle β with the magnetoresistor MR1.

Furthermore, it is assumed that a permanent magnet 16 is placed above the plane 14 and produces a magnetic field with a component in the plane 14 denoted H. This field H makes an angle θ with the reference direction x. The magnet 16 can rotate about its axis 18. This magnet may be fixed on an object 19, for which the angular position is to be monitored.

Figure 2:
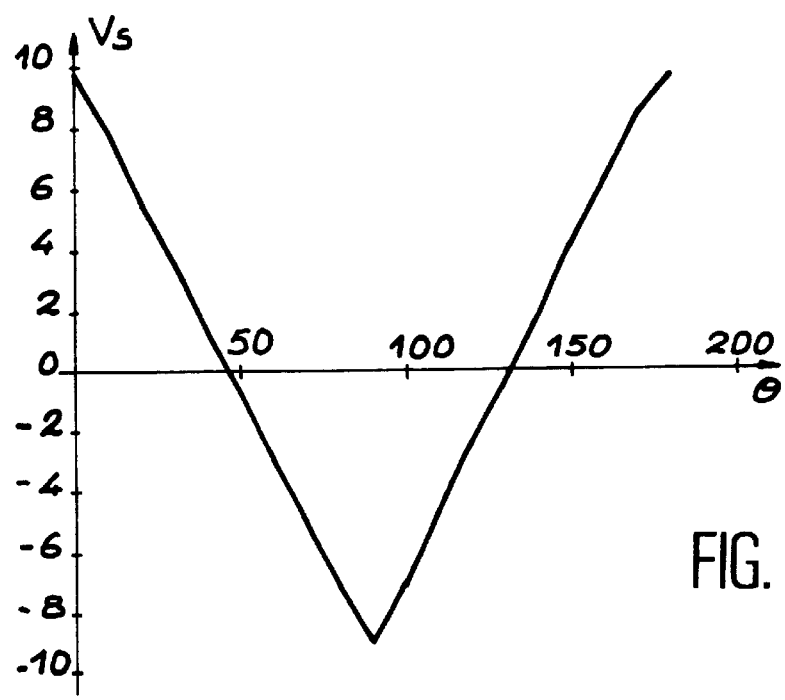
FIG. 2 shows the response of this device.

FIG. 2 shows an experimental curve obtained using the sensor in FIG. 1, in the case in which the magnetoresistors are composed of two thin magnetic layers made of FeNi separated by a thin silver layer. This curve shows the output voltage Vs sampled at the midpoint PM of the bridge, as a function of the angle θ that the component H of the field makes with the reference direction. The curve in FIG. 2 is not centered on the origin, since in the case shown the angle β between the reference axis and MR1 is not equal to 45°. When it is equal, the response range varies from −90° to +90° and the linear range varies from −45° to 45°.

Figure 3:
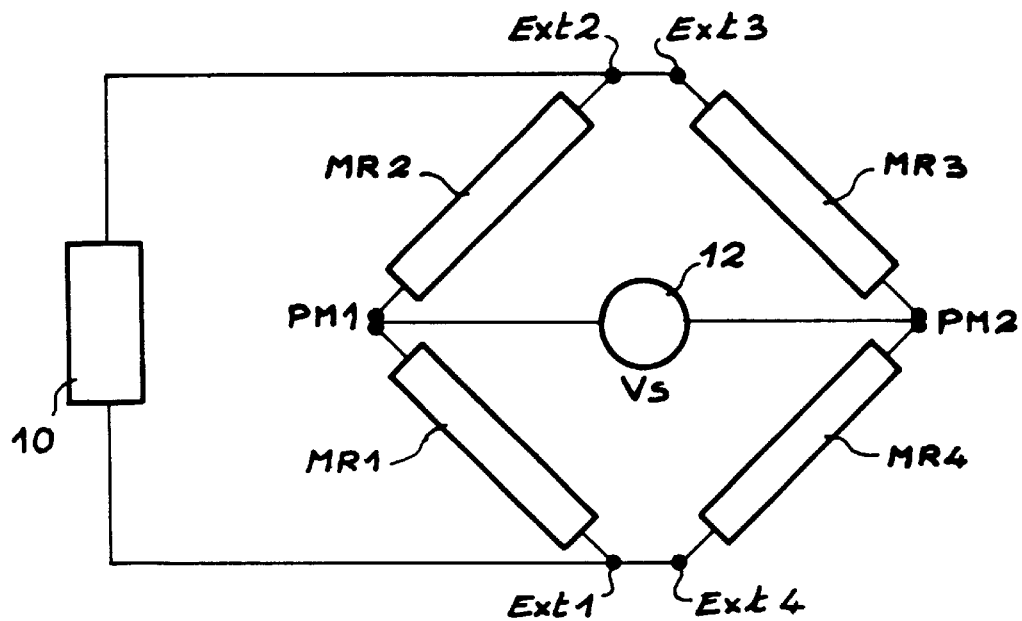
FIG. 3 diagrammatically shows a sensor with two bridges, in other words with four magnetoresistors.

FIG. 3 shows a sensor in which two bridges of the type shown in FIG. 1 have been combined. These bridges have ends Ext1, Ext2 and Ext3, Ext4 respectively, and two midpoints PM1 and PM2 respectively. Ends Ext2, Ext3 are connected together, and ends Ext1, Ext4 are connected together. This thus gives a Wheatstone bridge with four magnetoresistors. The read signal is always taken between the midpoints and one of the ends of the bridge, which is the same as taking the signal between the midpoints PM1 and PM2.

Figure 4:
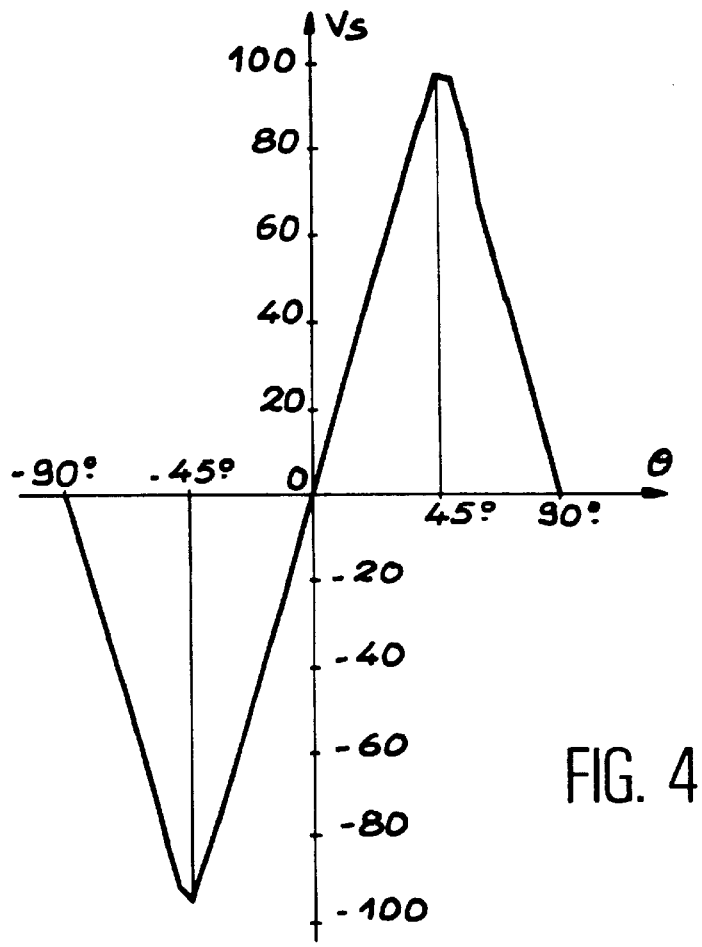
FIG. 4 shows the response of this sensor.

FIG. 4 shows the output signal Vs as a function of the angle θ. It can be seen that the signal is remarkably linear from −45° to +45°. This arrangement has the advantage that it eliminates the DC component output from the bridge.

Figure 5:
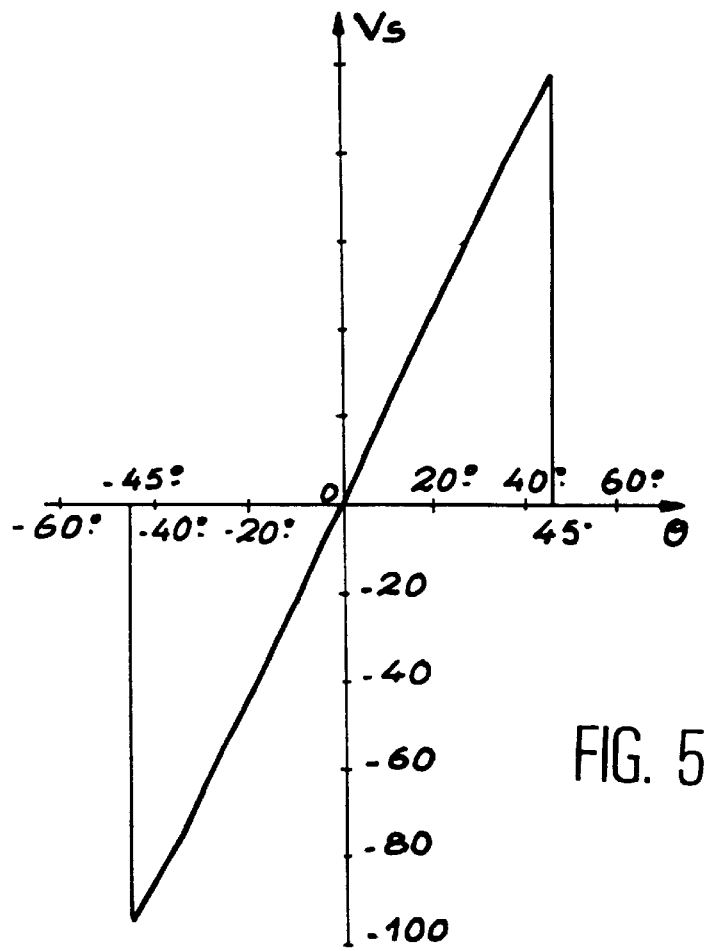
FIG. 5 shows the same response but magnified between −45° C. and 45° C.

FIG. 5 shows the same signal but enlarged between −45° and +45°, so that linearity can be better evaluated. If the magnet is fixed on a control button, the Wheatstone bridge sensor in FIGS. 3 and 4 would output a signal, for which the amplitude would follow the button rotation linearly.

Figure 6:
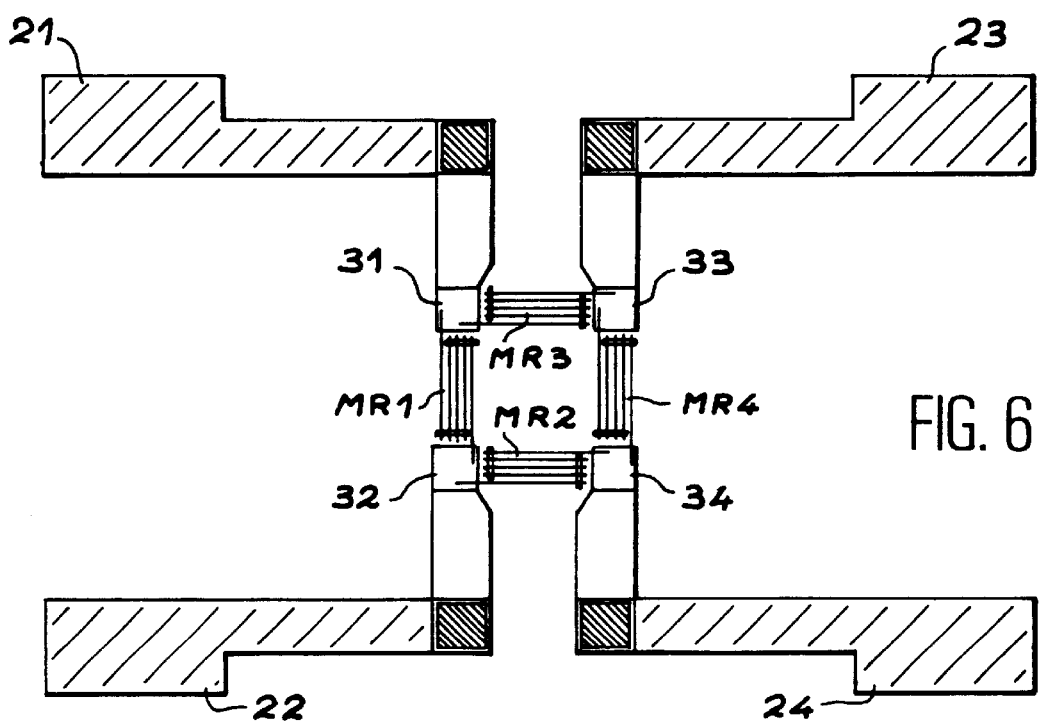
FIG. 6 illustrates an embodiment of a device according to the invention in a Wheatstone bridge configuration with four magnetoresistors.

FIG. 6 illustrates an embodiment of a sensor with four FeNi/Ag magnetoresistors placed in a square layout, in other words at 90° from each other. These magnetoresistors are also marked with references MR1, MR2, MR3 and MR4. They are assumed to be made in the form of a meandering tape with folded arms. Four external contact pads 21, 22, 23 and 24 are connected to four internal pads 31, 32, 33 and 34. Pad 32 forms the midpoint for the bridge (MR1, MR2) and pad 33 forms the midpoint for the bridge (MR3, MR4). Therefore, the measurement signal is sampled between the external pads 22, 23. Pads 31 and 34 form the ends of the bridges (MR1, MR2) and (MR3, MR4). Therefore the power supply voltage is applied between the outside pads 21, 24.

Figure 7:
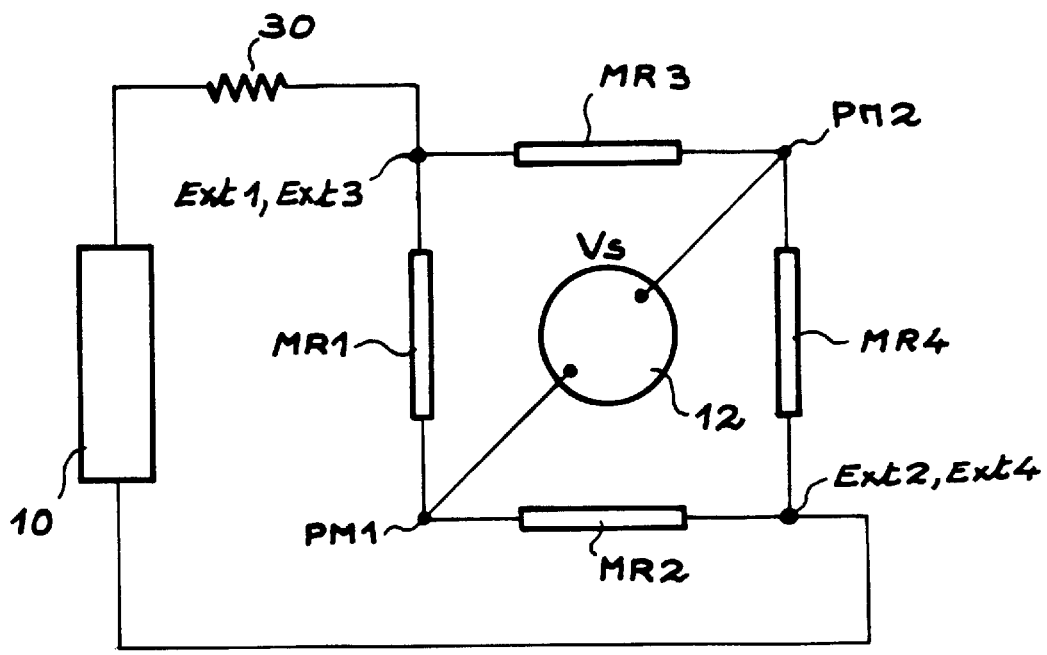
FIG. 7 shows an advantageous variant with a stabilizing resistance in series.
Figure 8:
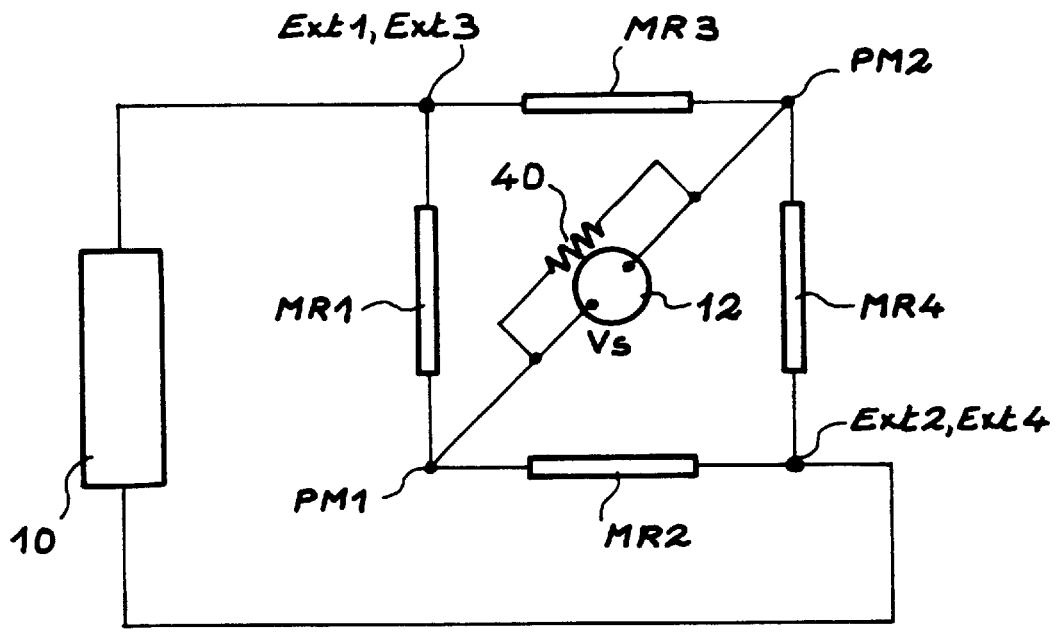
FIG. 8 shows another variant with a stabilizing resistance in parallel.

The linearity of the sensor according to the invention can be made even better by the improvements shown in FIGS. 7 and 8. These Figures show a Wheatstone bridge with four magnetoresistors, marked with the same references as above, and a resistance composed of a magnetoresistive material with sensitivity at least as high as the material used to make the magnetoresistors of the bridge. In the case shown in FIG. 7, this resistance 30 is placed in series at the bridge input, whereas in the case in FIG. 8, this resistance 40 is placed in parallel on the output.

What is claimed is:

1. A linear angular sensor constituted by two magnetoresistors of a material with giant magnetoresistance effect and with isotropic response, said magnetoresistors being positioned perpendicularly to one another, wherein each of said two magnetoresistors is in the form of a tape, each of said magnetoresistors having a shape anisotropy such that its response in a magnetic field is anisotropic, said magnetoresistors being connected in series and forming a bridge with two ends and a midpoint, said midpoint providing a substantially linear signal over an angular range of 90°, a power supply means being connected at the ends of the bridge, and means for measuring the unbalance of the bridge being connected at the midpoint of the bridge.

2. A linear angular sensor comprising a first sensor as claimed in claim 1, said first sensor having two first magnetoresistors, forming a first bridge with two first ends and a first midpoint, and comprising a second sensor as claimed in claim 1, said second sensor having two second magnetoresistors forming a second bridge with two second ends and a second midpoint, said first ends of said first bridge being connected with said second ends of said second bridge, said first and second magnetoresistors forming a Wheatstone bridge, the power supply means powering said Wheatstone bridge between said first and second connected ends, and the measurement means being connected between said first and second midpoints.

3. A linear angular sensor according to claim 2, wherein each magnetoresistor is in the form of a folded tape.

4. A linear angular sensor according to claim 2, wherein the magnetoresistors are laid out in a square.

5. A linear angular sensor according to claim 4, comprising four connection pads arranged at the four corners of the square formed by the magnetoresistors, each magnetoresistor being connected to two of said pads at its ends.

6. A linear angular sensor according to claim 2, and further comprising at least one resistance made of a magnetoresistive material placed in series between the power supply means and one of the ends of the bridge, the sensitivity of this magnetoresistive material to the magnetic field being at least as good as the sensitivity of the magnetoresistors of the bridge.

7. A linear angular sensor according to claim 2, and further comprising a resistance made of a magnetoresistive material placed in parallel with the measurement means between the two midpoints, the sensitivity of this magnetoresistive material to the magnetic field being at last as good as the sensitivity of the magnetoresistors in the bridge.

8. A linear angular sensor according to claim 1, wherein the magnetoresistors are made from a stack of layers selected from the group consisting of FeNi/Ag, Fe/Cr, Fe/Cu and NiFe/Cu.

9. A linear angular sensor according to claim 1, wherein anisotropy shape is achieved by etching.

10. A linear angular sensor according to claim 1, wherein the signal is linear within 5% over said angular range of 90°.

* * * * *